US012683593B2

(12) United States Patent
John

(10) Patent No.: US 12,683,593 B2
(45) Date of Patent: Jul. 14, 2026

(54) CURRENT SYNTHESIZER

(71) Applicant: Renesas Design (UK) Limited, Bourne End (GB)

(72) Inventor: Dantes John, Munich (DE)

(73) Assignee: Renesas Design (UK) Limited, Bourne End (GB)

( * ) Notice: Subject to any disclaimer, the term of this patent is extended or adjusted under 35 U.S.C. 154(b) by 191 days.

(21) Appl. No.: 18/754,588

(22) Filed: Jun. 26, 2024

(65) Prior Publication Data

US 2026/0005684 A1    Jan. 1, 2026

(51) Int. Cl.
H03K 17/00     (2006.01)
H03K 5/1252     (2006.01)

(52) U.S. Cl.
CPC ......... H03K 17/002 (2013.01); H03K 5/1252 (2013.01)

(58) Field of Classification Search
CPC .... H03K 17/00; H03K 17/002; H03K 17/007; H03K 17/04106; H03K 17/0412; H03K 17/04123
USPC ................................ 327/103, 108, 322, 368
See application file for complete search history.

(56) References Cited

U.S. PATENT DOCUMENTS

| | | | |
|---|---|---|---|
| 8,786,270 B2 | 7/2014 | Wu et al. | |
| 9,419,627 B2 | 8/2016 | Guthrie et al. | |
| 9,667,260 B2 | 5/2017 | Guthrie et al. | |
| 9,887,579 B2 * | 2/2018 | Berard | H02J 9/062 |
| 11,031,881 B2 * | 6/2021 | Kanai | H02M 7/493 |
| 12,341,411 B2 * | 6/2025 | de Cremoux | H02M 3/07 |
| 2023/0155472 A1 | 5/2023 | De Cremoux | |

OTHER PUBLICATIONS

U.S. Appl. No. 18/361,240, filed Jul. 28, 2023.
U.S. Appl. No. 18/455,367, filed Aug. 24, 2023.
U.S. Appl. No. 18/675,769, filed May 28, 2024.

* cited by examiner

*Primary Examiner* — Hai L Nguyen
(74) *Attorney, Agent, or Firm* — SCULLY, SCOTT, MURPHY & PRESSER, P.C.

(57)     ABSTRACT

A current synthesizer for an electrical circuit configured to receive a measured current signal is provided. The measured current signal is dependent on a measurement of a current flowing through the electrical circuit. The current synthesizer includes a current modelling device configured to calculate the current flowing through the electrical circuit and to generate a calculated current signal based on the calculation of the current, and a current signal generator configured to generate a digitized current signal comprising the measured current signal and the calculated current signal.

20 Claims, 9 Drawing Sheets

CURRENT SYNTHESIZER

The present disclosure relates to a current synthesizer and in particular, relates to a current synthesizer for an electrical circuit such as a switching converter.

BACKGROUND

A digital system such as a digital switching power converter, may use a digital signal that is representative of a current flowing through an energy storage element during operation. For example, a digitized current signal may be used by a controller for control of the switching operation of the digital switching converter.

SUMMARY

It is desirable to provide an improved system for providing a digitized current signal. For example, for switching converter control.

According to a first aspect of the disclosure there is provided a current synthesizer for an electrical circuit configured to receive a measured current signal, the measured current signal being dependent on a measurement of a current flowing through the electrical circuit, wherein the current synthesizer comprises a current modelling device configured to calculate the current flowing through the electrical circuit and to generate a calculated current signal based on the calculation of the current, and a current signal generator configured to generate a digitized current signal comprising the measured current signal and the calculated current signal.

Optionally, the electrical circuit is a switching converter comprising an energy storage element and a first power switch, the switching converter configured to receive an input voltage and provide an output voltage.

Optionally, the switching converter is one of a buck converter, a boost converter, or a buck-boost converter.

Optionally, the energy storage element comprises an inductor.

Optionally, the first power switch comprises a first transistor.

Optionally, the first transistor is a first metal oxide semiconductor field effect transistor (MOSFET).

Optionally, the first MOSFET is a p-type MOSFET or an n-type MOSFET.

Optionally, the current flowing through the electrical circuit is a current flowing through the energy storage element of the switching converter.

Optionally, the current modelling device is configured to calculate the current using one or more first properties of the switching converter.

Optionally, the one or more first properties comprises a first current path resistance of a first current path of the current, a first current path voltage of the first current path of the current, and an inductance of the energy storage element, wherein the energy storage element comprises an inductor.

Optionally, the first current path resistance comprises an equivalent series resistance of the inductor and a first pass device resistance of a first pass device.

Optionally, the first pass device is the first power switch or a first diode.

Optionally, the first current path voltage comprises the output voltage a first node voltage.

Optionally, the first node voltage is the input voltage or a ground voltage.

Optionally, the switching converter comprises a controller configured to provide a first control signal to the first power switch.

Optionally, the control signal is a pulse width modulation (PWM) signal.

Optionally, the current modelling device is configured to detect a controller output signal and to calculate the current using the controller output signal.

Optionally, the current synthesizer comprises a current measurement selection unit configured to select the measured current signal from a plurality of sensed current signals.

Optionally, each sensed current signal is received from current sensor, and each of the current sensors is configured to measure the current at a different part of the electrical circuit from each of the other analog to digital converters.

Optionally, at least one of the current sensors comprises a sigma delta modulator.

Optionally, the current measurement selection unit comprises a multiplexer configured to receive the plurality of sensed current signals, select one of the plurality of sensed current signals, and provide the selected sensed current signal as the measured current signal.

Optionally, the current measurement selection unit comprises a mode selection unit configured to detect a first characteristic of the electrical circuit, and control the multiplexer to select one of the plurality of sensed current signals based on the detected first characteristic.

Optionally, the mode selection unit comprises a debouncer configured to transition the multiplexer between states after a first time period has elapsed after a previous transition.

Optionally, the electrical circuit is a switching converter configured to receive an input voltage and provide an output voltage, the switching converter comprising an energy storage element, the energy storage element comprising an inductor, a first power switch, a first pass device, and the plurality of sensed current signals comprises two or more of an inductor current, a first power switch current, and a first pass device current.

Optionally, the first pass device is a second power switch or a first diode.

Optionally, each sensed current signal is received from an analog to digital converter.

Optionally, the switching converter comprises a controller configured to provide a first control signal to the first power switch, the current measurement selection unit comprises a multiplexer configured to receive the plurality of sensed current signals, select one of the plurality of sensed current signals, and provide the selected sensed current signal as the measured current signal, and a mode selection unit configured to detect a first characteristic of the switching converter using the first control signal, and control the multiplexer to select one of the plurality of sensed current signals based on the detected first characteristic.

Optionally, the current signal generator is configured to generate the digitized current signal by applying a first filter operation to the calculated current signal to provide a filtered calculated current signal, applying a second filter operation to the measured current signal to provide a filtered measured current signal, and generating the digitized current signal using the filtered calculated current signal and the filtered measured current signal.

Optionally, the first filter operation is a high pass filter operation such that the filtered calculated current signal is a high pass filtered calculated current signal and the second filter is a low pass filter operation such that the filtered measured current signal is a low pass filtered calculated current signal.

Optionally, the high pass and low pass filter operations are complementary.

Optionally, the current signal generator is configured to generate the digitized current signal using the high pass filtered calculated current signal and the low pass filtered measured current signal by adding the high pass filtered calculated current signal and the low pass filtered measured current signal together.

Optionally, the current signal generator comprises a first high pass filter, a first low pass filter, and summing circuitry, wherein the first high pass filter is configured to apply the high pass filter operation to the calculated current signal and to provide the high pass filtered calculated current signal, the first low pass filter is configured to apply the low pass filter operation to the measured current signal and to provide the low pass filtered measured current signal, and the summing circuitry is configured to generate the digitized current signal by adding the high pass filtered calculated current signal and the low pass filtered measured current signal together.

Optionally, the summing circuitry comprises a first addition circuit, wherein the first high pass filter is configured to provide the high pass filtered calculated current signal to the first addition circuit, the first low pass filter is configured to provide the low pass filtered measured current signal to the first addition circuit, and the first addition circuit is configured to generate the digitized current signal by adding the high pass filtered calculated current signal and the low pass filtered measured current signal together.

Optionally, the first low pass filter is a $4^{th}$ order Bessel filter and/or the first high pass filter is a $4^{th}$ order Bessel filter.

Optionally, the summing circuitry comprises a second addition circuit, and the first high pass filter comprises a second low pass filter configured to apply the low pass filter operation to the calculated current signal and to provide a low pass filtered calculated current signal, and the second addition circuit configured to receive the calculated current signal and the low pass filtered calculated current signal, subtract the low pass filtered calculated current signal from the calculated current signal to provide the high pass filtered calculated current signal, and provide the high pass filtered calculated current signal to the first addition circuit.

Optionally, the second low pass filter is a $4^{th}$ order Bessel filter.

According to a second aspect of the disclosure there is provided a method of generating a digitized current signal using a current synthesizer for an electrical circuit, the method comprising receiving a measured current signal, the measured current signal being dependent on a measurement of a current flowing through the electrical circuit, calculating the current flowing through the electrical circuit using a current modelling device, generating a calculated current signal based on the calculation of the current using the current modelling device, and generating the digitized current signal comprising the measured current signal and the calculated current signal using a current signal generator.

It will be appreciated that the method of the second aspect may include providing and/or using features of the first aspect, and may include other features as described herein.

BRIEF DESCRIPTION OF THE DRAWINGS

The disclosure is described in further detail below by way of example and with reference to the accompanying drawings in which.

DETAILED DESCRIPTION

A digitized current signal may be generated by sensing the current directly and converting it to a digital format using analog-to-digital converters (ADC). However, direct current sensing may be impractical due to the high sample rates required for practical use, as well as the latency of such a scheme.

A synthetically generated current can be scaled up to very high time and amplitude resolution and further does not see significant latency (often zero latency). Such a synthetic current is generated using a digital circuit called a current synthesizer.

It should be noted that the digitized current signal as provided by a current synthesizer may be referred to as a "synthetic current" or a "synthetic current signal".

This synthetic current as provided by a current synthesizer may be used directly as a replacement for measured current in a current mode converter but may also find alternate uses for load-line control, telemetry or load transient detection.

Such techniques for synthetic current generation may use information available within the switching power converter to synthesize a digital representation of the current in the inductor within the power converter. The information may include: voltages at various nodes; knowledge of the equivalent series resistance across the inductor; the inductance of the inductor; and driver delays and rise/fall times. The equivalent series resistance across the inductor may comprise trace resistances, pass device resistances and the inductor resistance.

Some of the information listed above (for example, the node voltages including an input VIN and/or an output voltage VOUT), is typically already available in a switching converter as it is needed for closing the voltage loop and for pulse width modulation (PWM) generation.

Typically, some form of current measurement is required to compensate for variations and drift in the equivalent series resistance across the inductor and the inductance, or other small errors in the aforementioned parameters. This usually requires the addition of current sense circuits.

Known methods may use current sense ADCs to calibrate an internal current synthesizer, typically using the samples from such ADCs to change the slope or offset of the internal current synthesis circuit such that eventually the internally synthesized current is a faithful reproduction of the present value of the current in the inductor.

While the bandwidth requirements on such current sense circuits are less than what would otherwise be required for full digital conversion of the current signal, it nevertheless becomes challenging to effectively calibrate the synthesized current at high frequencies due to the required high sample rates.

Figures 1A, 1B:
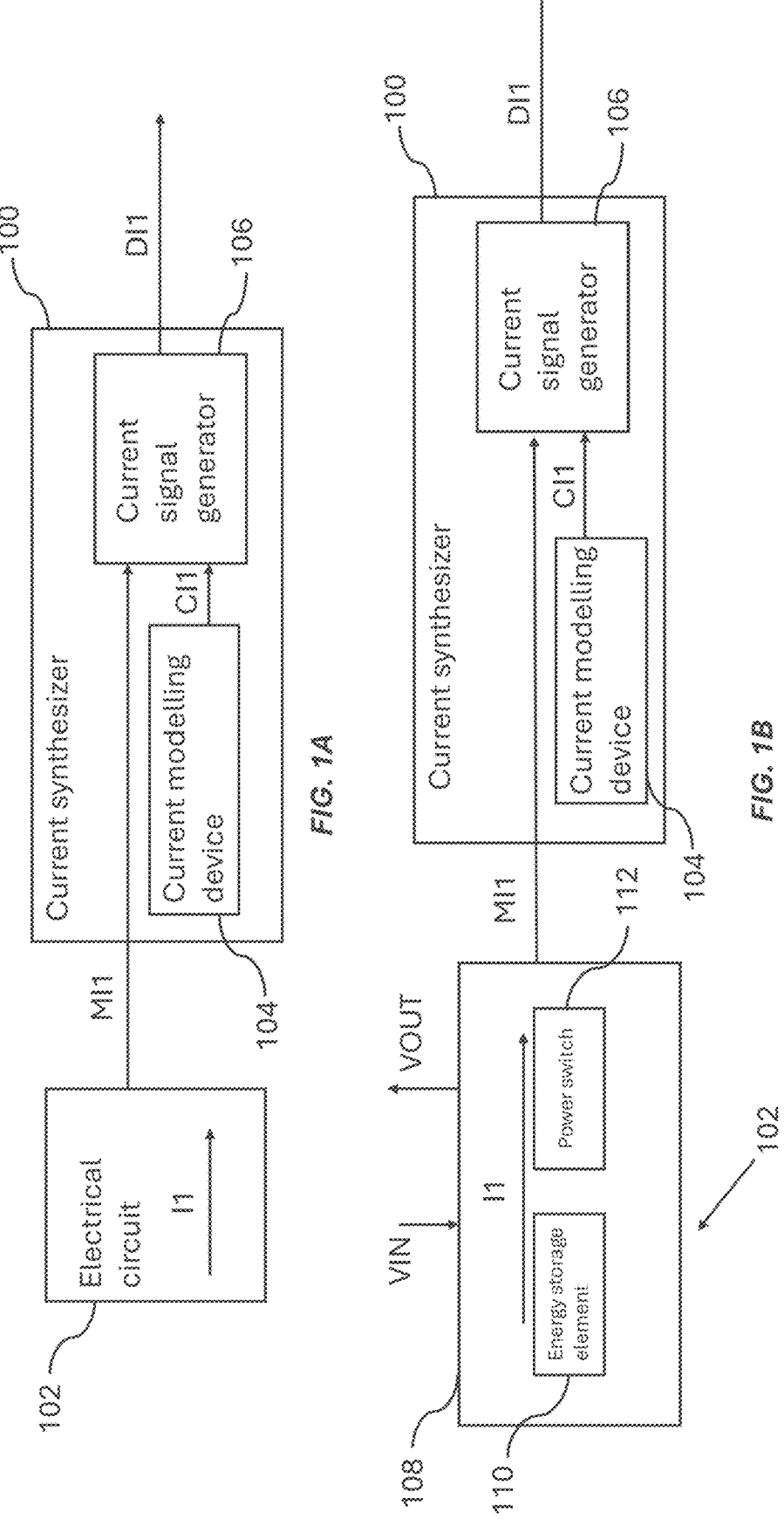
FIG. 1A is a schematic of a current synthesizer for an electrical circuit in accordance with a first embodiment of the present disclosure.
FIG. 1B is a schematic of the current synthesizer and the electrical circuit, in accordance with a second embodiment of the present disclosure.

FIG. 1A is a schematic of a current synthesizer 100 for an electrical circuit 102 in accordance with a first embodiment of the present disclosure. During operation, a current I1 flows through the electrical circuit 102. The current synthesizer 100 is configured to receive a measured current signal MI1. The measured current signal MI1 is dependent on a measurement of the current I1 that flows through the electrical circuit 102 during its operation.

The current synthesizer 100 comprises a current modelling device 104 that is configured to calculate the current I1 that flows through the electrical circuit 102 during its operation, and to generate a calculated current signal CI1 that is based on the calculation of the current I1.

The current synthesizer 100 further comprises a current signal generator 106 that is configured to generate a digitized current signal DI1 comprising the measured current signal MI1 and the calculated current signal CI1.

The current signal generator 106 may be configured to generate the digitized current signal D1 by applying a first filter operation to the calculated current signal CI1, applying a second filter operation to the measured current signal MI1, and then using the filtered signals for the generation of the digitized current signal D1.

It will be appreciated that in specific embodiments, any of the filter operations described herein may be applied using software filtering and/or hardware filtering.

For example, the first filter operation may be a high pass filter operation, such that the calculated current signal CI1 is high pass filtered to provide a high pass filtered calculated current signal; and the second filter operation may be a low pass filter operation, such that the measured current signal MI1 is low pass filtered to provide a low pass filtered measured current signal.

The high pass and low pass filtering operations may be complimentary, such that the low pass filtering operation removes, or otherwise attenuates, the frequencies that are maintained in the high pass filtering operation, whilst the high pass filtering operation removes, or otherwise attenuates, the frequencies that are maintained in the low pass filtering operation.

The current signal generator 106 may generate the digitized current signal DI1 by adding the high pass filtered calculated current signal and the low pass filtered measured current signal.

Instead of calibrating the current synthesizer using a closed loop correction circuit, as is the case in known systems, the digitized current signal DI1 can simply be the sum of the low-bandwidth measured current (being the low pass filtered measured current signal) and the high pass filtered version of the synthetic current (being the high pass calculated current signal). The calculated current signal CI1 may have incorrect low frequency information, but this will be removed and replaced by the accurate measured current in the generation of the digitized current signal DI1.

The low-bandwidth measured current may be provided from a current telemetry circuit. The calculated current signal CI1 may be generated using known/assumed parameters of the electrical circuit 102 such as an input voltage, output voltage, PWM information etc.

FIG. 1B is a schematic of the current synthesizer 100 and the electrical circuit 102, in accordance with a second embodiment of the present disclosure. In the present embodiment the electrical circuit 102 is a switching converter 108 that comprises an energy storage element 110 and a power switch 112. The switching converter 108 is configured to receive an input voltage VIN and to provide an output voltage VOUT. The switching converter 108 may, for example, be a buck converter, a boost converter or a buck-boost converter. The energy storage element 110 may comprise an inductor. The power switch 112 may comprise a transistor, for example, a metal oxide semiconductor field effect transistor (MOSFET), which may be p-type or n-type, in accordance with the understanding of the skilled person.

In the present embodiment, the current I1 is the current that flows through the energy storage element 110 of the switching converter 108.

The current modelling device 104 may use information relating to the switching converter 108 to calculate the current I1 that flows in the switching converter 108 during its operation. The information may include one or more properties of the switching converter 108 such as a current path resistance of the current path of the current I1; a current path voltage of the current path; and an inductance of the inductor.

The current path resistance may be the equivalent series resistance of the inductor, as discussed previously, and may comprise trace resistances, pass device resistances and the inductor resistance. The current path voltage may comprise voltages at nodes within the switching converter 108, and may comprise the input voltage VIN and the output voltage VOUT.

Figure 2A:
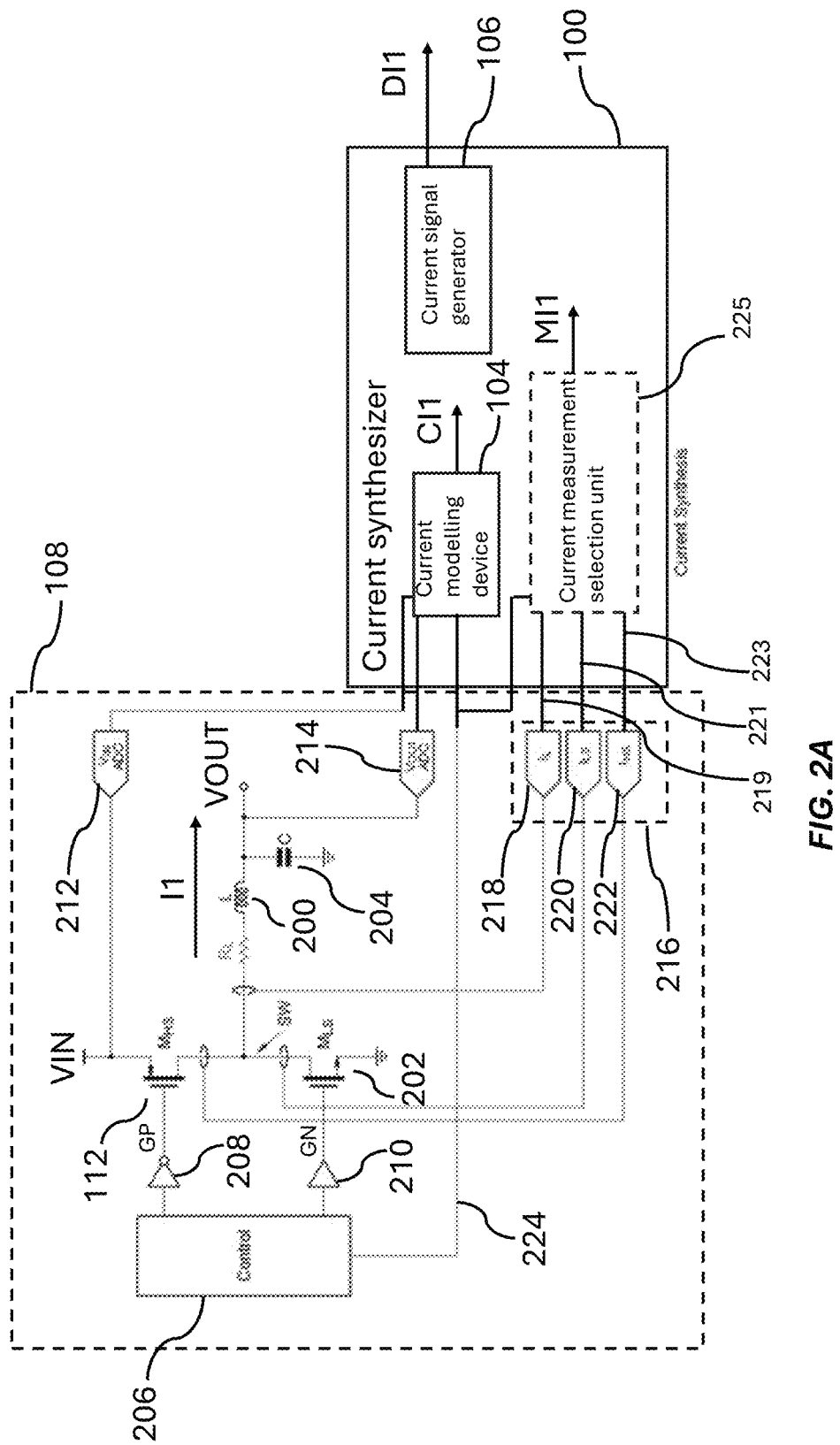
FIG. 2A is a schematic of specific embodiments of the current synthesizer and the switching converter in accordance with a third embodiment of the present disclosure.

FIG. 2A is a schematic of specific embodiments of the current synthesizer 100 and the switching converter 108 in accordance with a third embodiment of the present disclosure. In the present embodiment, the energy storage element 110 is an inductor 200. In the present example, the digitized current signal DI1 may be referred to as a digitized inductor current, as it is a digital representation of the current I1 flowing through the inductor 200.

The switching converter 108 comprises a power switch 202 and a capacitor 204. The switching converter 108 further comprises a controller 206 for driving the switching operation of the power switch 112 and the power switch 202 using a control signal GP and a control signal GN, respectively. The control signals GP, GN may be pulse width modulation (PWM) signals.

The switches 112, 202 may be referred to as pass devices. During operation, the controller 206 provides switching signals to the power switches 112, 202 through drivers 208, 210. The drivers 208, 210 are used to provide control signals GP, GN of sufficient strength and voltage levels to turn on/off the switches 112, 202 quickly and safely. The control signals GP, GN may be referred to as "gate drive voltages".

It will be appreciated that in a further embodiment, the switch 202 may be replaced by a different pass device, such as a diode, with a single control signal being provided to the power switch 112 to operate the switching converter 108, in accordance with the understanding of the skilled person.

A buck converter converts the input voltage VIN to a lower output voltage VOUT. It does this by alternately connecting a SW node to the input voltage node or ground, and then using the inductor 200 and the capacitor 204 to filter out the resulting ripple. $R_L$ is a resistance that includes the inductor resistance and the routing resistance.

In the present embodiment, the switching converter 108 further comprises a first voltage detector comprising an analog to digital converter (ADC) 212 for detecting the input voltage VIN; and a second voltage detector comprising an ADC 214 for detecting the output voltage VOUT.

The switching converter 108 further comprises a current sensing module 216 for sensing the current I1 in the switching converter 108. The current sensing module 216 may comprise one or more current sensors, with there being three current sensors 218, 220, 222 in the present embodiment. The current sensor 218 is arranged to measure the current I1 during all phases of operation of the switching converter 108, whereas the current sensor 220 and the current sensor 222 are for measuring the current I1 during a magnetization phase and a demagnetization phase, respectively.

The current sensor 218 is configured to provide a sensed current signal 219 that comprises information on the current I1 as sensed by the current sensor 218; the current sensor 220 is configured to provide a sensed current signal 221 that comprises information on the current I1 as sensed by the current sensor 220; and the current sensor 222 is configured to provide a sensed current signal 223 that comprises information on the current I1 as sensed by the current sensor 222.

One or more of the current sensors 218, 220, 222 may comprise an analog to digital converter (ADC) which may comprise a sigma delta modulator.

The current synthesizer 100 may further comprise a current measurement selection unit 225 to select one of the sensed current signals 219, 221, 223 to provide as the measured current signal MI1. In the present embodiment, the current signal 219 comprises the inductor current, the current signal 221 comprises the current flowing through the power switch 112 and the current signal 223 comprises the current flowing through the power switch 202.

In a specific embodiment, the current modelling device 104 may be configured to calculate the current I1 using one or more properties of the switching converter 108, as discussed previously in relation to FIG. 1B. The properties may include one or more of: a current path resistance; a current path voltage; or an inductance of the inductor 200.

For example, the current path resistance may comprise an equivalent series resistance of the inductor 200 and a pass device resistance of one of the pass devices. For example, the resistance of the pass device may be the resistance of one of the switches 112, 202, or for further embodiment comprising a pass device implemented using a diode, the resistance of the diode.

For example, the current path voltage may comprise the output voltage VOUT and a node voltage, where the node voltage may be the input voltage VIN or the ground voltage.

During a magnetization phase, the current path voltage may comprise the output voltage VOUT and the input voltage VIN, such that the current path voltage is the voltage across the current path from the input voltage VIN to the output voltage VOUT, and be substantially equal to VIN–VOUT.

During a demagnetization phase the current path voltage may comprise the output voltage VOUT and the ground voltage, such that the current path voltage is the voltage across the current path from the ground voltage to the output voltage VOUT, and be substantially equal to –VOUT, where the ground voltage is 0V.

The current modelling device 104 may be configured to detect a controller output signal 224 from the controller 206. The controller output signal 224 may comprise information on one or both of the control signals GP, GN. In a further embodiment, the controller output signal 224 may be one or both of the control signals. During operation, the current modelling device 104 may use the information provided by the controller output signal 224 in the calculation of the current I1.

Figure 2B:
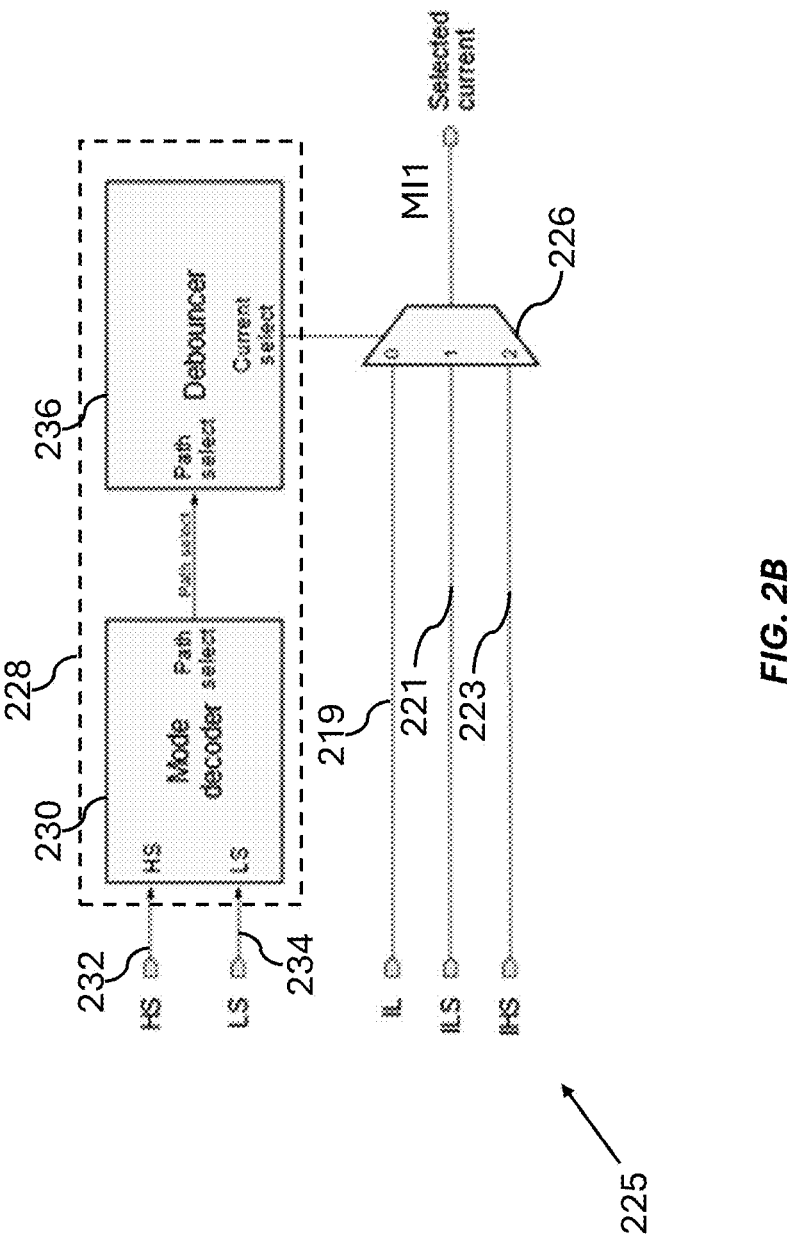
FIG. 2B is a schematic of a specific embodiment of the current measurement selection unit.

FIG. 2B is a schematic of a specific embodiment of the current measurement selection unit 225. In the present embodiment, the current measurement selection unit 225 comprises a multiplexer 226 that receives the sensed current signals 219, 221, 223 and selects one of the signals 219, 221, 223 to provide as the measured current signal MI1.

The current measurement selection unit 225 may comprise a mode selection unit 228 which detects a characteristic of the switching converter 108 and controls the multiplexer 226 to select one of the signals 219, 221, 223 based on the detected characteristic. In the present embodiment, the mode selection unit 228 comprises a mode decoder 230 that is configured to receive information relating to one or more characteristics of the switching converter. In the present embodiment, the information is received by signals 232, 234 that may relate to the present operational phase of the switching converter 108. The signal 232 may, for example, be the high side switching signal (as denoted by GP in FIG. 2A), and the signal 234 may, for example, be the low side switching signal (as denoted by GN in FIG. 2B). The signals 232, 234 may be provided by the signal 224 from the controller 206. The detected characteristic may, for example, be the duty cycle of one of the signals 232, 234.

The mode selection unit 228 may further comprise a debouncer 236 that is configured to transition the multiplexer 226 between states after a specific time period has elapsed after a previous transition. This can ensure that the multiplexer 226 does not rapidly switch between states.

In a specific embodiment, during operation, the appropriate ADC 218, 220, 222 to use may be selected after determining which of the ADCs 218, 220, 222 has the most accurate result (typically the ADC having a larger sampling window, which may be indicated by which of the signals HS or LS is longer) and after passing through the debouncer 236 to reduce the risk of rapidly changing between several inputs.

Returning to FIG. 2A, the switches 112, 202 form the power stage of the buck converter. Based on the output of the controller 206, these switches 112, 202 drive the SW mode to the supply voltage (VIN) or ground. The switching waveform is filtered using the LC filter formed by the inductor 200 and the capacitor 204 to get a DC output voltage VOUT with a small ripple. The equivalent series resistance seen across the inductor 200 comprises the resistance of the inductor 200, the pass device resistance (being the resistance of the switch 112 during the magnetization phase, and the resistance of the switch 202 during the demagnetization phase) and trace resistances. In the present embodiment, the voltages VIN, VOUT are measured using the ADCs 212, 214.

It will be appreciated that current sensing module 216 may be implemented in other ways, in accordance with the understanding of the skilled person. For example, the output current may be sensed by a current to voltage converter, which is then fed to an analog to digital converter to generate a digital code that is representative of the current. Other implementations may average the current before conversion, or may convert the current directly into digital, for example using a delta sigma modulation.

It may be advantageous to use a low-bandwidth low power current sense circuit (such as a delta sigma current sensing method). Delta-sigma based approaches may generate high frequency out of band noise which is preferably filtered out, and embodiments of the present disclosure may accommodate such filtering as required, and in accordance with the understanding of the skilled person. In such a case a decimation filter may be used. This low pass decimation filter can simply be a reuse of the low pass filter transfer function (LPF) as described below. In further embodiments, instead of the delta sigma current sense, any ordinary current sense and ADC scheme may be used.

The current may be measured by measuring the voltage across an element with some resistance. This element may be the pass device but can also be another resistance that already exists in the current path (e.g. a known copper trace) or another which is deliberately added (a sense resistor for e.g., in series with the inductor). The schematic shown in FIG. 2A shows three example locations where such currents may be measured, and as result in the generation of the signals 219, 221, 223.

In summary, a delta sigma converter may be used for current measurement. In further embodiments, this could be replaced by other current measurement circuits if the result of that measurement circuit is a digital signal that provides the inductor current. Such circuits may have a signal bandwidth limited to lower frequencies due to practical circuit limitations.

Figures 3A, 3B, 3C:
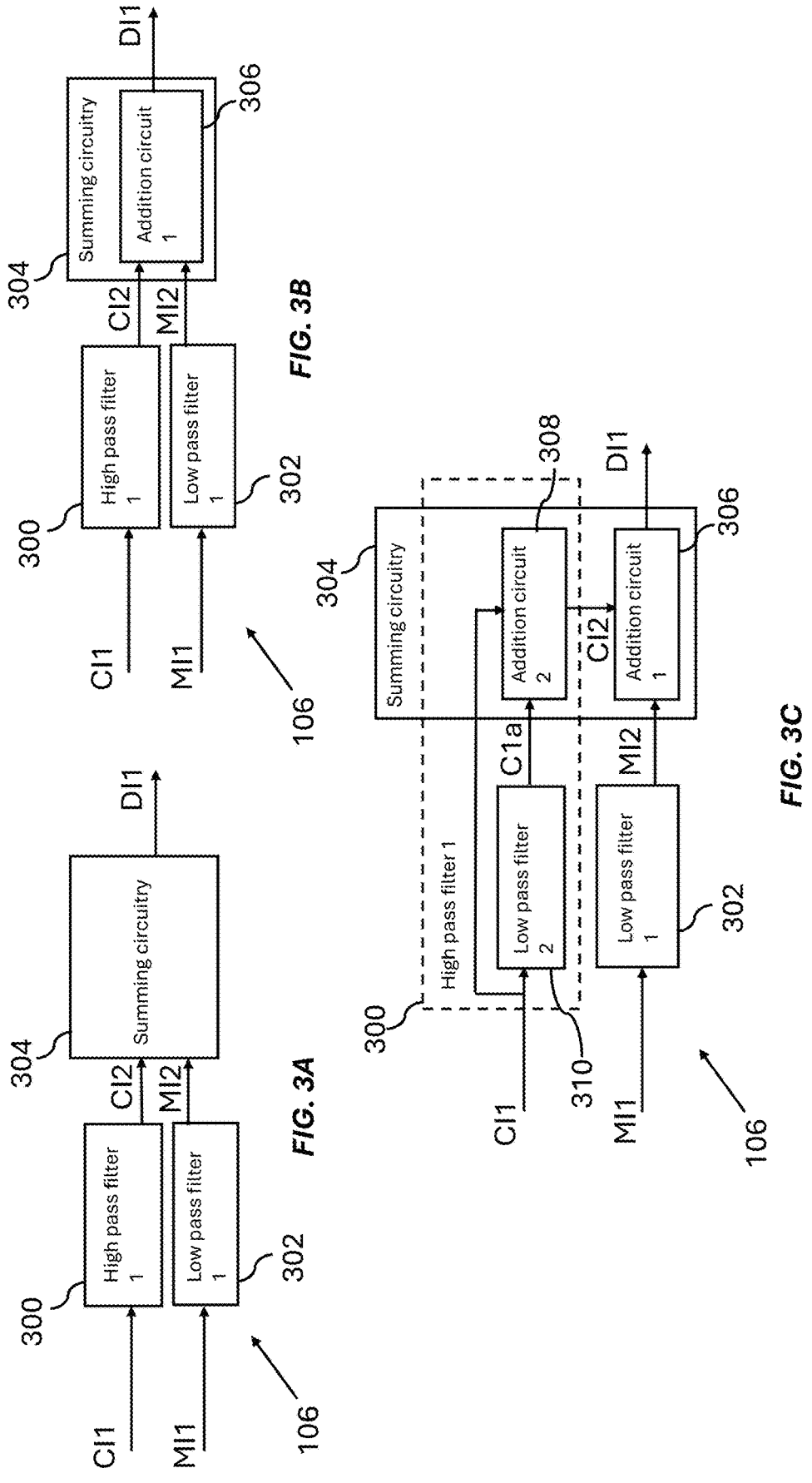
FIG. 3A is a schematic of a specific implementation of the current signal generator in accordance with a fourth embodiment of the present disclosure.
FIG. 3B is a schematic of a specific embodiment of the current signal generator as shown in FIG. 3A, and in accordance with a fifth embodiment of the present disclosure.
FIG. 3C is a schematic of a specific implementation of the current signal generator as shown in FIG. 3B with a specific implementation of the high pass filter, in accordance with a sixth embodiment of the present disclosure.

It is known that mismatches in equivalent series resistance REQ and inductance L will result in mismatches during transients. In many applications this is not a problem, and further production tests can provide approximately correct values that can be used in production trimming of the parts to minimize the impact of such errors. One alternative option would be to add background calibration. Such background calibration would calibrate the current synthesizer 100. Therefore, in a specific embodiment, background calibration may be applied to the synthetic current generator 100 to further improve the performance during transients FIG. 3A is a schematic of a specific implementation of the current signal generator 106 as may be implemented within any of the embodiments described herein, in accordance with the understanding of the skilled person, and in accordance with a fourth embodiment of the present disclosure.

The current signal generator 106 comprises a high pass filter 300, a low pass filter 302 and summing circuitry 304.

In a specific embodiment, one or both of the high pass filter 300 and the low pass filter 302 may be implemented using a $4^{th}$ order Bessel filter.

During operation, the high pass filter 300 receives the calculated current signal CI1 and applies a high pass filter operation to the calculated current signal CI1 to provide a high pass filtered calculated current signal CI2.

During operation, the low pass filter receives the measured current signal MI1 and applies a low pass filter operation to the measured current signal MI1 to provide a low pass filtered measured current signal MI2.

The summing circuitry 304 is configured to generate the digitized current signal DI1 by adding the high pass filtered calculated current signal CI2 and the low pass filtered measured current signal MI2.

FIG. 3B is a schematic of a specific embodiment of the current signal generator 106 as shown in FIG. 3A, and in accordance with a fifth embodiment of the present disclosure. In the present embodiment, both filtered signals CI2, MI2 are provided to the summing circuitry 304 which comprises an addition circuit 306. The addition circuit 306 is configured to generate the digitized current signal DI1 by adding the high pass filtered calculated current signal CI2 and the low pass filtered measured current signal MI2.

FIG. 3C is a schematic of a specific implementation of the current signal generator 106 as shown in FIG. 3B with a specific implementation of the high pass filter 300, in accordance with a sixth embodiment of the present disclosure.

In the present embodiment, the summing circuitry 304 further comprises an addition circuit 308. The high pass filter comprises a low pass filter 310 and the addition circuit 308.

The low pass filter 310 is configured to apply the low pass filter operation to the calculated current signal CI1 The low pass filter operation as applied by the low pass filter 310 may be the same low pass filter operation as provided by the low pass filter 302. The low pass filter 310 is configured to provide a low pass filtered calculated current signal CI1a. The low pass filter 310 may be a $4^{th}$ order Bessel filter.

The addition circuit 308 is configured to receive the calculated current signal CI1 and the low pass filtered calculated current signal C1a, and then to subtract the low pass filtered calculated current signal C1a from the calculated current signal CI1, with the result being the high pass filtered calculated current signal CI2.

Figure 4A:
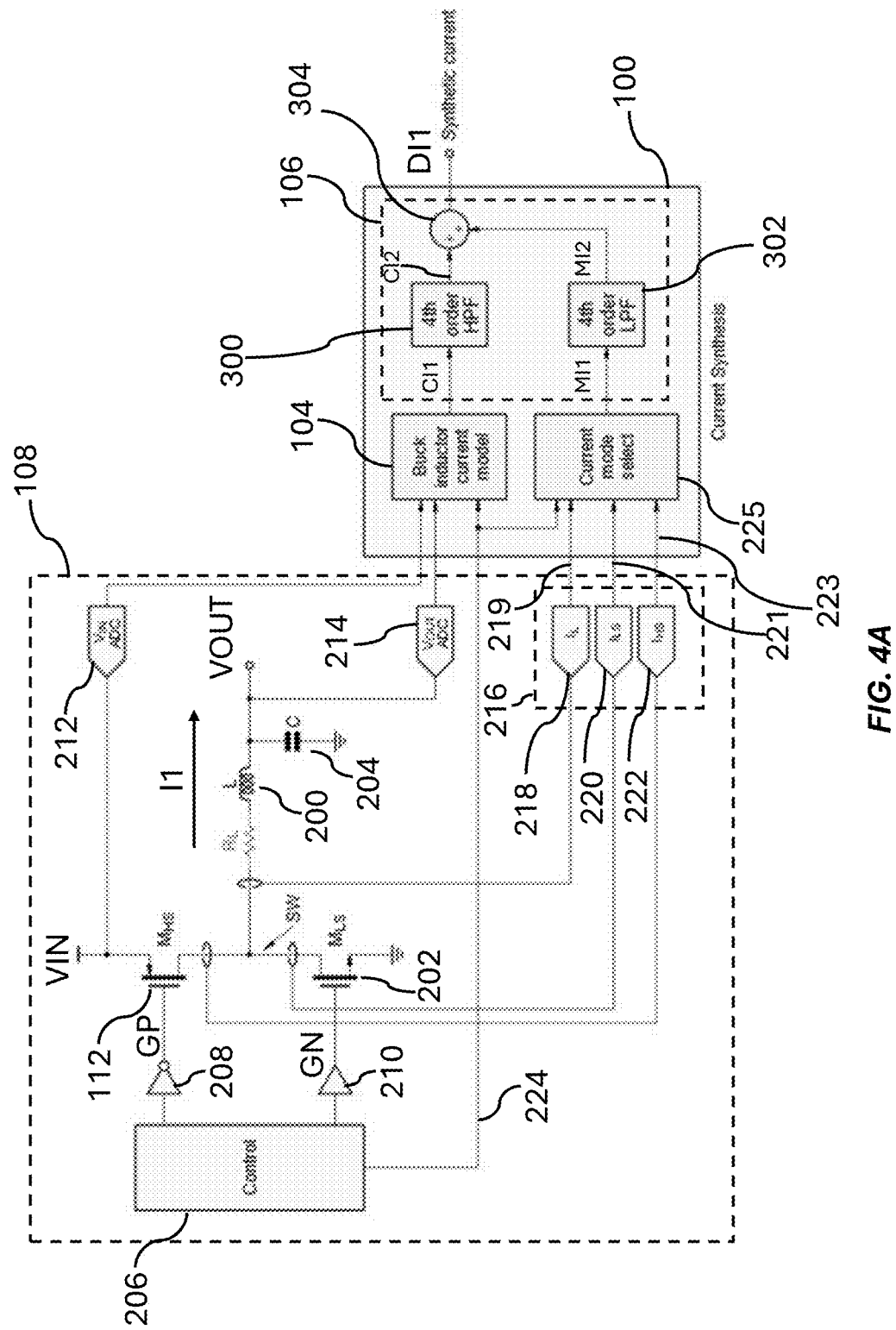
FIG. 4A is a schematic of a specific implementation of the current synthesizer as used with the switching converter, being a buck converter, in accordance with a seventh embodiment of the present disclosure.

FIG. 4A is a schematic of a specific implementation of the current synthesizer 100 as used with the switching converter 108, being a buck converter, in accordance with a seventh embodiment of the present disclosure. Specifically, the current signal generator 106 is implemented as described in relation to FIG. 3A.

In the present embodiment, the information (in digital form) from the measured current circuit (delta sigma or otherwise), being the measured current signal MI1, is low pass filtered to obtain a signal that is primarily composed of low frequencies, being the low pass filtered measured current signal MI2. The low pass filtered measured current signal MI2 provides the low-frequency part of the digitized current signal DI1. There are several possible implementations for the low pass filter 302 as will be clear to the skilled person. In a specific embodiment, the low pass filter 302 may be implemented as a $4^{th}$ order Bessel filter since it gives reasonable suppression of out-of-band noise, low complexity, reduced ringing compared to Butterworth/Chebyshev filters, and acceptable latency.

In parallel to the generation of the measured current signal MI1, a synthetic current CI1 is generated by the current modelling device 104. The calculated current signal CI1 may be generated using values of equivalent series resistance REQ and inductance L that may differ from the actual equivalent series resistance REQ and the inductance L, such that there may be errors, particularly at different DC levels.

In the present embodiment, the measured currents MI1 are accurate at lower frequencies, while the higher frequency contents are absent due to bandwidth limitations of measurement. Conversely, the synthetic current CI1 will be sufficiently accurate at high frequencies (subject to limits on errors in equivalent series resistance REQ and inductance L) but may have incorrect low frequency content.

The high pass filter 300 removes the low frequency content of the synthetic current CI1 which is then added to the result of the measured current, which is processed by the low pass filter 302, such that the resulting current DI1 closely reflects the actual current in the inductor 200.

In summary, the signals MI1, CI1 generated in both paths will be summed together after passing through transfer functions to shape their frequency response. Typically, those transfer functions will be complementary so that the low frequency that is removed from the synthetic current CI1 will be complemented by the measured current MI1 from the current sense circuit 216, thereby providing an accurate digitized current signal DI1.

In the present example, the current ADC 220 senses the voltage across the switch 202. The ADC 220 will generate an output that depends on the average value of the inductor current during the LS phase of conversion. This will be the same as the average value of inductor current, as will be clear to the skilled person.

In a further embodiment, a measurement may also be taken using the switch 112. This should have the same value as the result from the switch 202. However, for a buck operating with large duty cycles (e.g. VIN to VOUT has a small difference only), the switch 112 measurement may be preferred. In further embodiments, one or more of the ADCs 218, 220, 222 may be omitted where other current sense circuits will suffice. For example, it is also possible to measure the current using a resistor in series with the inductor 200.

Note that all current ADCs 218, 220, 222 may not be required for all applications. Depending on the duty cycles and the operating modes, some can be omitted, as will be clear to the skilled person. The current mode select block 225 may select the input from the appropriate current ADC depending on the input from controller 206 on which type of switching device is predominantly active.

Figure 4B:
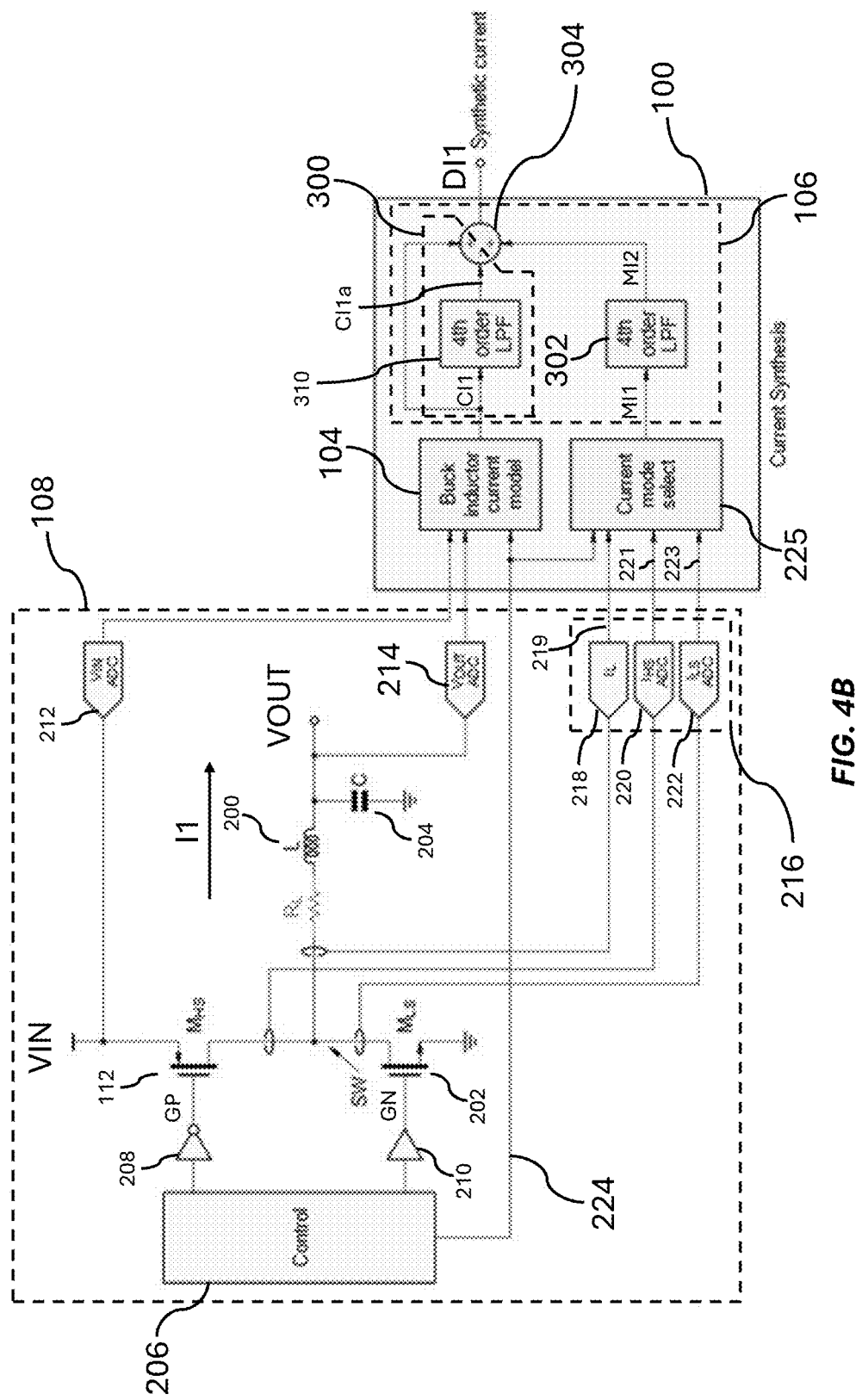
FIG. 4B is a schematic of a specific implementation of the current synthesizer as used with the switching converter, being a buck converter, in accordance with an eighth embodiment of the present disclosure.

FIG. 4B is a schematic of a specific implementation of the current synthesizer 100 as used with the switching converter 108, being a buck converter, in accordance with an eighth embodiment of the present disclosure. Specifically, the current signal generator 106 may be implemented substantially as described in relation to FIG. 3C.

It will be appreciated that the high pass filter 300 of FIG. 4A shows a general implementation of the high pass filter 300 which provides a high pass filter transfer function of HPF. In the present specific embodiment, the high pass filter transfer function HPF is implemented as 1-LPF where LPF is the low pass filter 310 transfer function. The low pass filters 302, 310 may both provide the same transfer function LPF.

It should be noted that the dashed line denoting the high pass filter 300 passes through the summing circuitry 304 to denote that part of the summing circuitry 304 contributes to the high pass filtering operation, for example as shown in FIG. 3C. It will be appreciated that the summing circuitry 304 may be implemented as shown in FIG. 3C with the addition circuits 306, 308.

Figure 4C:
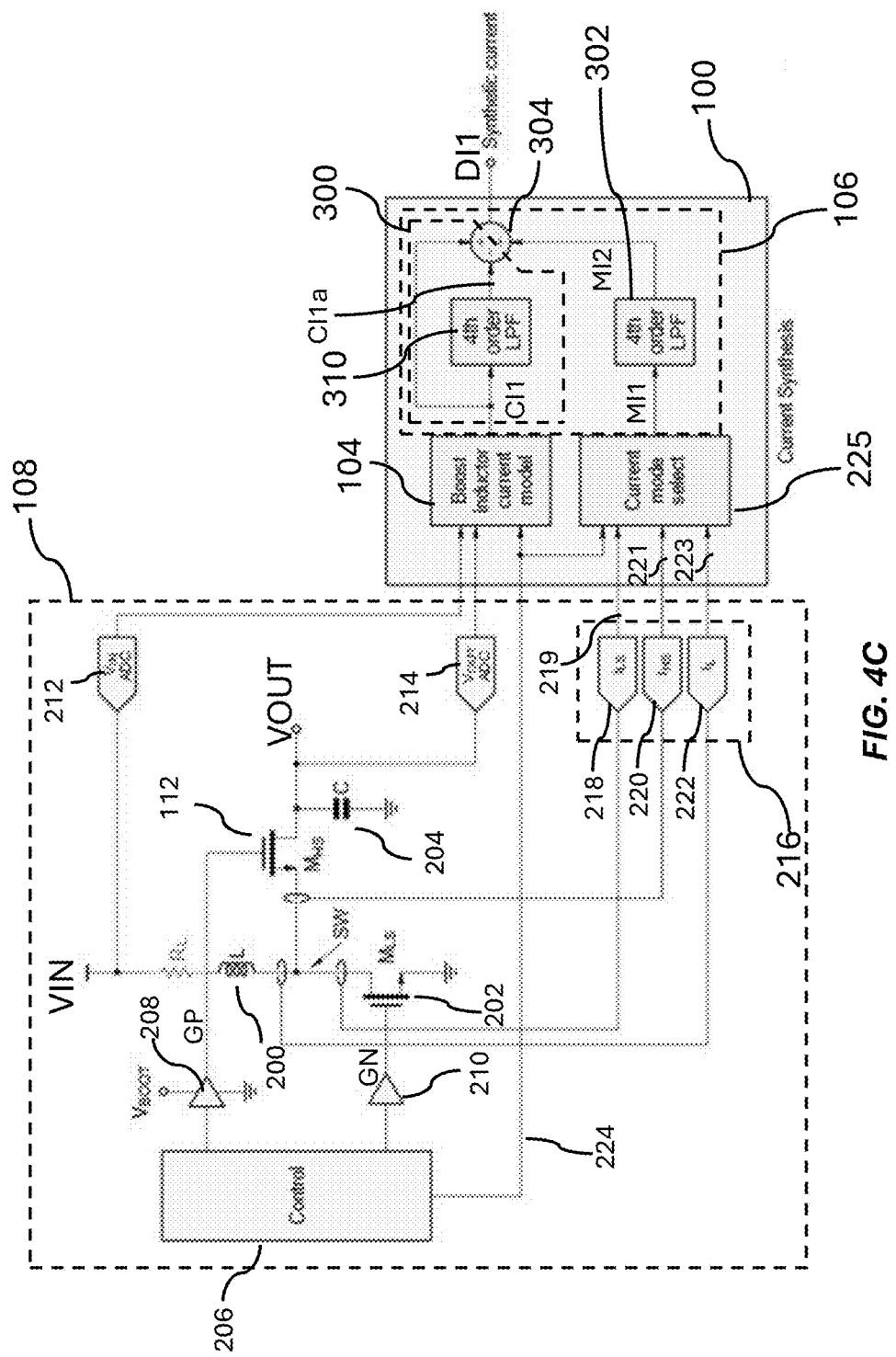
FIG. 4C is a schematic of a specific implementation of the current synthesizer as used with the switching converter, being a boost converter, in accordance with a ninth embodiment of the present disclosure.

FIG. 4C is a schematic of a specific implementation of the current synthesizer 100 as used with the switching converter 108, being a boost converter, in accordance with a ninth embodiment of the present disclosure.

The boost converter may use a current sense on the LS side to get the DC current. The HS switch 112 is an NMOS in this example and uses the driver 208 driven off the bootstrapped supply.

Figure 4D:
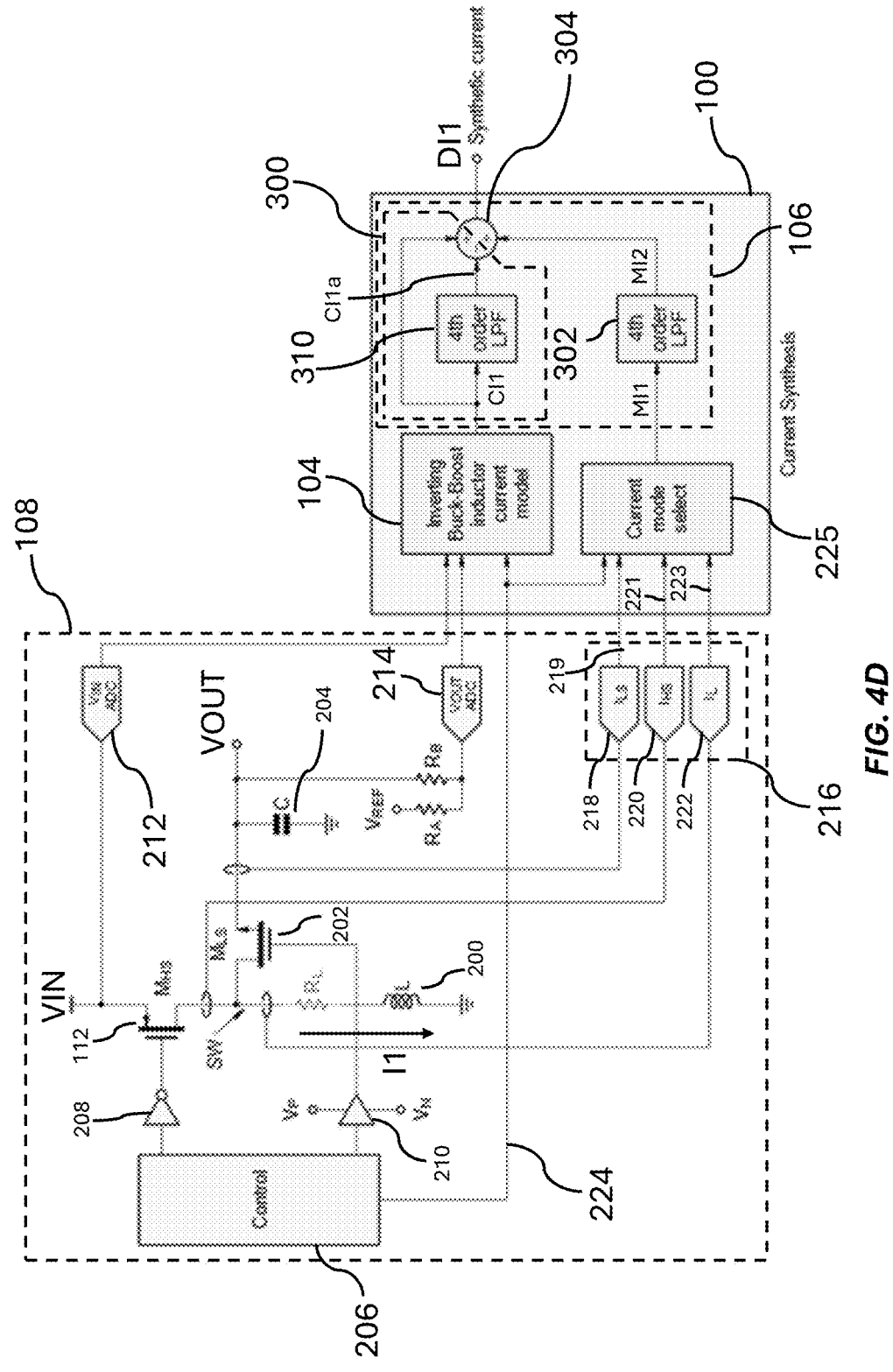
FIG. 4D is a schematic of a specific implementation of the current synthesizer as used with the switching converter, being an inverting buck-boost converter, in accordance with a tenth embodiment of the present disclosure.

FIG. 4D is a schematic of a specific implementation of the current synthesizer 100 as used with the switching converter 108, being an inverting buck-boost converter, in accordance with a tenth embodiment of the present disclosure. The switching converter 108 of the present embodiment further comprises resistors RA, RB.

The inverting buck boost may use a HS current sense at the supply side the get the DC current. An optional resistor network (RA, RB) is used at the input to the VOUT ADC 214 to bring the negative output voltage to the positive voltage range input of the ADC 214.

Figure 4E:
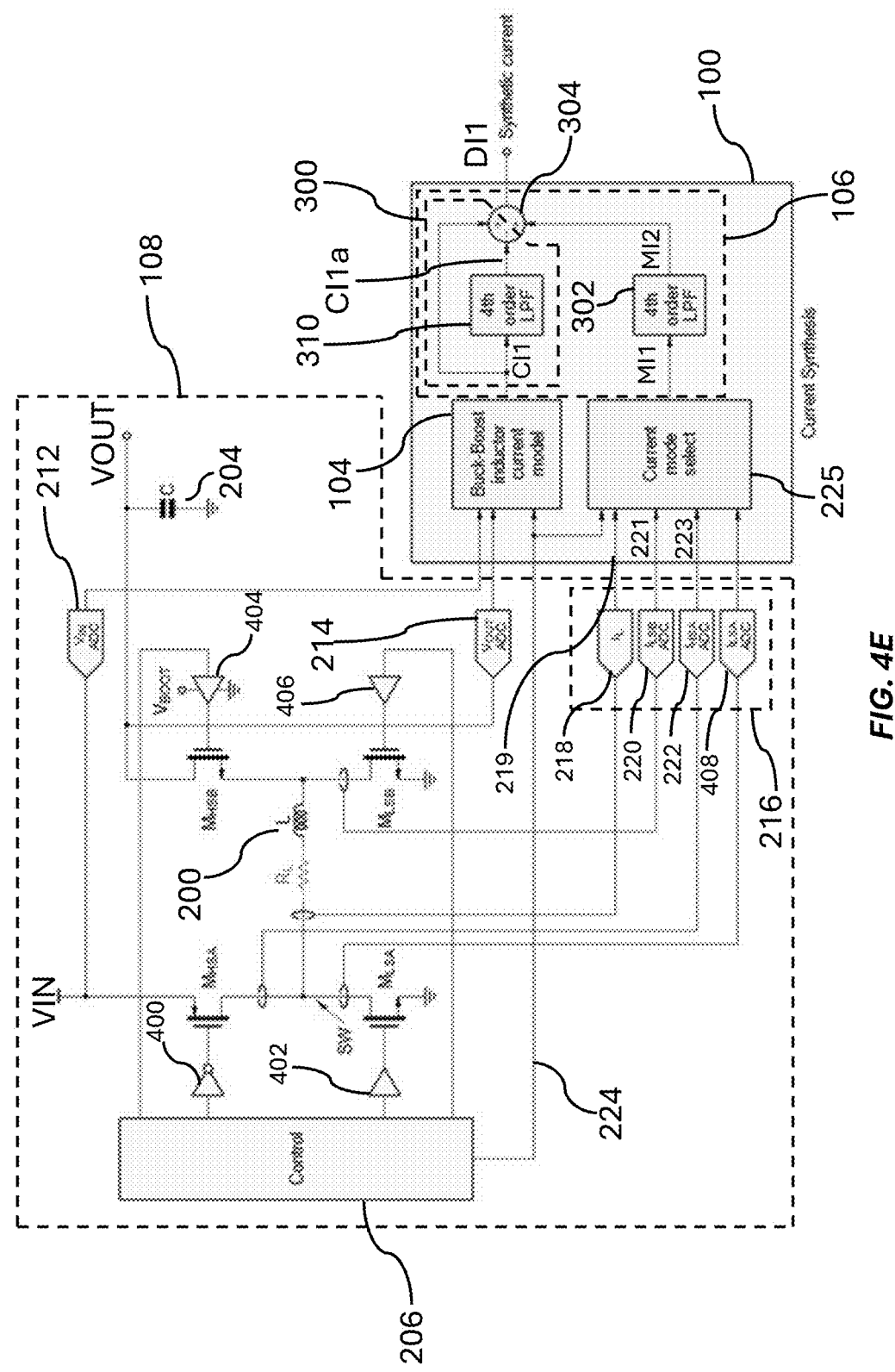
FIG. 4E is a schematic of a specific implementation of the current synthesizer as used with the switching converter, being a non-inverting buck-boost converter, in accordance with an eleventh embodiment of the present disclosure.

FIG. 4E is a schematic of a specific implementation of the current synthesizer 100 as used with the switching converter 108, being a non-inverting buck-boost converter, in accordance with an eleventh embodiment of the present disclosure.

The switching converter comprises switches $M_{HSA}$, $M_{LSA}$, $M_{HSB}$, $M_{LSB}$ and gate drivers 400, 402, 404, 406. The current sensing module 216 comprises a current sensor 408.

For the positive buck-boost, there are 4 possible states of switch pairs being active. Depending on the mode, one of 3 ADCs is sufficient to measure current. As before, if the use cases are limited because a particular phase dominates with switching cycle, the others can be omitted.

| $M_{HSA}$ | $M_{HSB}$ | $M_{LSA}$ | $M_{LSB}$ | Current ADC |
|---|---|---|---|---|
| ON | ON | | | $I_{HSA}$ ADC |
| ON | | | ON | $I_{HSA}/I_{LSB}$ ADC |
| | | ON | ON | $I_{LSA}$ ADC |
| | | ON | ON | $I_{LSA}/I_{LSB}$ ADC |

Embodiments of the present disclosure may provide one or more of the following advantages:

1. There may be no stability issues as there are no complex control loops in the system. Also, because of this higher-order filters may be used for current data from a delta sigma converter (to remove high-frequency noise) without affecting stability.

2. The DC level may be as accurate as that permitted by analog circuitry. The inaccuracies in the computed synthetic current are suppressed at low frequencies due to the high-pass filter.

Common reference numerals and variables between Figures refer to common features. Various improvements and modifications may be made to the above without departing from the scope of the disclosure.

The invention claimed is:

1. A current synthesizer for an electrical circuit configured to:

receive a measured current signal, the measured current signal being dependent on a measurement of a current flowing through the electrical circuit;

wherein the current synthesizer comprises:

a current modelling device configured to calculate the current flowing through the electrical circuit and to generate a calculated current signal based on the calculation of the current; and a current signal generator configured to generate a digitized current signal comprising the measured current signal and the calculated current signal.

2. The current synthesizer of claim 1, wherein the electrical circuit is a switching converter comprising an energy storage element and a first power switch, the switching converter configured to receive an input voltage and provide an output voltage.

3. The current synthesizer of claim 2, wherein the current modelling device is configured to calculate the current using one or more first properties of the switching converter.

4. The current synthesizer of claim 3, wherein the one or more first properties comprises:

a first current path resistance of a first current path of the current;

a first current path voltage of the first current path of the current; and an inductance of the energy storage element, wherein the energy storage element comprises an inductor.

5. The current synthesizer of claim 4, wherein the first current path resistance comprises an equivalent series resistance of the inductor and a first pass device resistance of a first pass device.

6. The current synthesizer of claim 4, wherein the first current path voltage comprises the output voltage a first node voltage.

7. The current synthesizer of claim 4, wherein the switching converter comprises a controller configured to provide a first control signal to the first power switch.

8. The current synthesizer of claim 1, comprising a current measurement selection unit configured to select the measured current signal from a plurality of sensed current signals.

9. The current synthesizer of claim 8, wherein:

each sensed current signal is received from one of a plurality of current sensors; and each of the plurality of current sensors is configured to measure the current at a different part of the electrical circuit from each of the other current sensors of the plurality of current sensors.

10. The current synthesizer of claim 8, wherein the current measurement selection unit comprises a multiplexer configured to:

receive the plurality of sensed current signals;

select one of the plurality of sensed current signals; and provide the selected sensed current signal as the measured current signal.

11. The current synthesizer of claim 10, wherein the current measurement selection unit comprises a mode selection unit configured to:

detect a first characteristic of the electrical circuit; and control the multiplexer to select one of the plurality of sensed current signals based on the detected first characteristic.

12. The current synthesizer of claim 11, wherein the mode selection unit comprises a debouncer configured to transition the multiplexer between states after a first time period has elapsed after a previous transition.

13. The current synthesizer of claim 1, wherein the current signal generator is configured to generate the digitized current signal by:

applying a first filter operation to the calculated current signal to provide a filtered calculated current signal;

applying a second filter operation to the measured current signal to provide a filtered measured current signal; and generating the digitized current signal using the filtered calculated current signal and the filtered measured current signal.

14. The current synthesizer of claim 13, wherein the first filter operation is a high pass filter operation such that the filtered calculated current signal is a high pass filtered calculated current signal and the second filter is a low pass filter operation such that the filtered measured current signal is a low pass filtered calculated current signal.

15. The current synthesizer of claim 14, wherein the high pass and low pass filter operations are complementary.

16. The current synthesizer of claim 14, wherein the current signal generator is configured to generate the digitized current signal using the high pass filtered calculated current signal and the low pass filtered measured current signal by adding the high pass filtered calculated current signal and the low pass filtered measured current signal together.

17. The current synthesizer of claim 14, wherein the current signal generator comprises:

a first high pass filter;

a first low pass filter; and summing circuitry;

wherein:

the first high pass filter is configured to apply the high pass filter operation to the calculated current signal and to provide the high pass filtered calculated current signal;

the first low pass filter is configured to apply the low pass filter operation to the measured current signal and to provide the low pass filtered measured current signal; and the summing circuitry is configured to generate the digitized current signal by adding the high pass filtered calculated current signal and the low pass filtered measured current signal together.

18. The current synthesizer of claim 17, wherein the summing circuitry comprises a first addition circuit;

wherein:

the first high pass filter is configured to provide the high pass filtered calculated current signal to the first addition circuit;

the first low pass filter is configured to provide the low pass filtered measured current signal to the first addition circuit; and the first addition circuit is configured to generate the digitized current signal by adding the high pass filtered calculated current signal and the low pass filtered measured current signal together.

19. The current synthesizer of claim 18, wherein:

the summing circuitry comprises a second addition circuit;

the first high pass filter comprises a second low pass filter configured to apply the low pass filter operation to the calculated current signal and to provide a low pass filtered calculated current signal; and the second addition circuit configured to:

receive the calculated current signal and the low pass filtered calculated current signal;

subtract the low pass filtered calculated current signal from the calculated current signal to provide the high pass filtered calculated current signal; and provide the high pass filtered calculated current signal to the first addition circuit.

20. A method of generating a digitized current signal using a current synthesizer for an electrical circuit, the method comprising:

receiving a measured current signal, the measured current signal being dependent on a measurement of a current flowing through the electrical circuit;

calculating the current flowing through the electrical circuit using a current modelling device;

generating a calculated current signal based on the calculation of the current using the current modelling device; and generating the digitized current signal comprising the measured current signal and the calculated current signal using a current signal generator.

* * * * *